(12) United States Patent
Tang et al.

(10) Patent No.: US 9,953,813 B2
(45) Date of Patent: Apr. 24, 2018

(54) METHODS AND APPARATUS FOR IMPROVED METAL ION FILTERING

(71) Applicant: APPLIED MATERIALS, INC., Santa Clara, CA (US)

(72) Inventors: Xianmin Tang, San Jose, CA (US); Joung Joo Lee, San Jose, CA (US); Guojun Liu, San Jose, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 229 days.

(21) Appl. No.: 14/707,825

(22) Filed: May 8, 2015

(65) Prior Publication Data

US 2015/0357171 A1 Dec. 10, 2015

Related U.S. Application Data

(60) Provisional application No. 62/009,158, filed on Jun. 6, 2014.

(51) Int. Cl.
| | | |
|---|---|---|
| *C23C 14/34* | (2006.01) | |
| *H01J 37/34* | (2006.01) | |
| *C23C 14/35* | (2006.01) | |
| *H01L 21/02* | (2006.01) | |

(52) U.S. Cl.
CPC .......... *H01J 37/3447* (2013.01); *C23C 14/35* (2013.01); *H01J 37/3405* (2013.01); *H01J 37/345* (2013.01); *H01J 37/3452* (2013.01); *H01L 21/02104* (2013.01); *H01J 2237/3322* (2013.01)

(58) Field of Classification Search
CPC .. H01J 37/3447; H01J 37/3405; H01J 37/345; H01J 37/3452; H01J 2237/3322; C23C 14/35; H01L 37/3452
See application file for complete search history.

(56) References Cited

U.S. PATENT DOCUMENTS

| | | | |
|---|---|---|---|
| 6,251,242 B1 | 6/2001 | Fu et al. | |
| 9,005,413 B2 * | 4/2015 | Kodaira | ................. C23C 14/35 204/298.16 |
| 2003/0015421 A1 | 1/2003 | Cha et al. | |

(Continued)

FOREIGN PATENT DOCUMENTS

| | | |
|---|---|---|
| JP | H10-88337 A | 4/1998 |
| JP | 2011-023649 A | 2/2011 |

OTHER PUBLICATIONS

International Search Report and Written Opinion dated Aug. 21, 2015 for PCT Application No. PCT/US2015/030738.

*Primary Examiner* — John J Brayton
(74) *Attorney, Agent, or Firm* — Moser Taboada; Alan Taboada (57) ABSTRACT

Methods and apparatus for improved metal ion filtering are provided herein. In some embodiments, a substrate processing apparatus includes: a chamber body and a chamber lid disposed on the chamber body defining a processing region within the chamber body beneath the lid; a collimator disposed in the processing region; a power source coupled to the collimator; and a first set of magnets disposed around the chamber body above the collimator and a second set of magnets disposed around the chamber body and below the collimator that together create a guidance magnetic field that is substantially orthogonal to the collimator.

20 Claims, 6 Drawing Sheets

(56) References Cited

U.S. PATENT DOCUMENTS

| | | | |
|---|---|---|---|
| 2003/0035906 A1* | 2/2003 | Memarian | C23C 14/0036 428/1.3 |
| 2004/0216993 A1 | 11/2004 | Sandhu | |
| 2006/0213764 A1* | 9/2006 | Cerio, Jr. | C23C 14/046 204/192.12 |
| 2011/0233050 A1* | 9/2011 | Leeser | C23C 14/35 204/192.12 |
| 2015/0114823 A1 | 4/2015 | Lee et al. | |
| 2015/0206724 A1* | 7/2015 | Pan | H01J 37/3447 204/192.12 |

\* cited by examiner

METHODS AND APPARATUS FOR IMPROVED METAL ION FILTERING

CROSS-REFERENCE TO RELATED APPLICATIONS

This application claims benefit of U.S. provisional patent application Ser. No. 62/009,158, filed Jun. 6, 2014, which is herein incorporated by reference in its entirety.

FIELD

Embodiments of the present disclosure generally relate to substrate processing chambers used in semiconductor manufacturing systems.

BACKGROUND

Reliably producing submicron and smaller features is a key technology for the next generation of very large scale integration (VLSI) and ultra large scale integration (ULSI) of semiconductor devices. However, as the miniaturization of circuit technology is pressed, the shrinking dimensions of interconnects in VLSI and ULSI technology have placed additional demands on the processing capabilities. The multilevel interconnects that lie at the heart of the VLSI and ULSI technology demand precise processing of high aspect ratio features, such as vias and other interconnects.

As circuit densities increase for next generation devices, the widths of interconnects, such as vias, trenches, contacts, gate structures and other features, as well as the dielectric materials therebetween, decrease to 45 nm and 32 nm, or lower, dimensions. However, the thickness of the dielectric layers remain substantially constant, resulting in increased depth to width aspect ratios of the features.

Sputtering, also known as physical vapor deposition (PVD), is a method of forming metallic features in integrated circuits. Sputtering deposits a material layer on a substrate. A source material, such as a target, is bombarded by ions strongly accelerated by an electric field to eject material from the target, which is then deposited on the substrate.

In a physical vapor deposition process, fast-moving ions strike the target, dislodging particles from the target surface. The particles may be charged by the interaction with the incident ions through a charge transfer mechanism. Alternatively, the particles may be charged through interaction with any electric fields existing in the space, or the particles may remain uncharged. Deposition generally occurs faster on field regions and near the tops of trench sidewalls. During deposition, ejected particles may travel in all directions, rather than travelling in directions generally orthogonal to the substrate surface, resulting in overhanging structures formed on the corners of the trench. Overhanging structures disposed on opposite sides of a trench or other opening may grow together, resulting in premature closing and thus preventing complete filling of the trench or opening and forming a hole or a void. When depositing conductive materials to form conductive pathways for a device, such holes or voids undesirably severely diminish the electrical conductivity of the formed feature. Moreover, the higher aspect ratios of trenches and vias in next generation devices are even harder to fill without voids.

Controlling the ion fractions or ion density reaching to the substrate surface at a certain range may improve the bottom and sidewall coverage during the metal layer deposition process. In one example, the particles dislodged from the target may be ionized and accelerated under an electrical bias applied to the substrate. The resulting narrow angular flux distribution encourages particles to travel down into the trench before early closing-up of the trench. It is believed that by increasing the ion fraction/ion density near the substrate surface may promote ion trajectories that are more orthogonal to the substrate. As accelerated ions approach the substrate surface, momentum carried from the accelerated ions may reach deeper down into the trench, whereupon they deflect toward the trench sidewall under the influence of the electrical bias. Nonetheless, the deeper penetration into the trench reduces the effect of overhang near the top of the sidewall. However, as the aspect ratios of the trenches are getting higher and substrate sizes are becoming larger, reaching down to the trench bottom is more difficult and uniformly depositing materials across the substrate surface is also more difficult. Thus, PVD processing remains a challenge to overcome the problem of overhang management.

Therefore, the inventors have provided improved methods and apparatus for forming a metal containing layer with good bottom and sidewall management.

SUMMARY

Embodiments of methods and apparatus for improved ion filtering are provided herein. In some embodiments, a substrate processing chamber includes: a chamber body and a chamber lid disposed on the chamber body defining a processing region within the chamber body beneath the lid; a collimator disposed in the processing region; a power source coupled to the collimator; and a first set of magnets disposed around the chamber body above the collimator and a second set of magnets disposed around the chamber body and below the collimator that together create a guidance magnetic field that is substantially orthogonal to the collimator.

In some embodiments, a substrate processing chamber includes: a chamber body and a chamber lid disposed on the chamber body defining a processing region within the chamber body beneath the lid; a target disposed under the chamber lid; a collimator disposed in the processing region under the lid; a DC power source coupled to the collimator; and a first set of magnets disposed around the chamber body above the collimator and a second set of magnets disposed around the chamber body and below the collimator that together create a guidance magnetic field that is substantially orthogonal to the collimator.

In some embodiments, a method of depositing a metal layer on a substrate includes: supplying a gas mixture into the processing chamber; applying a RF or DC source power to form a plasma from the gas mixture to sputter source material from a target disposed in the processing chamber; applying a DC bias power to a collimator disposed in the processing chamber; generating a guidance magnetic field substantially orthogonal to the collimator; and depositing the source material onto the substrate from the sputtered source material.

Other and further embodiments of the present disclosure are described below.

BRIEF DESCRIPTION OF THE DRAWINGS

Embodiments of the present disclosure, briefly summarized above and discussed in greater detail below, can be understood by reference to the illustrative embodiments of the present disclosure depicted in the appended drawings.

However, the appended drawings illustrate only typical embodiments of the present disclosure and are therefore not to be considered limiting of scope, for the present disclosure may admit to other equally effective embodiments.

To facilitate understanding, identical reference numerals have been used, where possible, to designate identical elements that are common to the figures. The figures are not drawn to scale and may be simplified for clarity. Elements and features of one embodiment may be beneficially incorporated in other embodiments without further recitation.

DETAILED DESCRIPTION

Embodiments of a method and apparatus for improved metal ion filtering are provided herein. In some embodiments, the inventive apparatus may advantageously control an ion/neutral filtering effect so as to efficiently control ion trajectory behavior and assist the bottom-up filling capability during the physical vapor deposition process. For example, embodiments of the present disclosure may facilitate depositing material within a feature formed on the substrate with good bottom and sidewall management by increased metal ionization with ion filtering and improved control of flux angular distribution for both ions and neutrals before they reach the substrate level. As described in greater detail below, the metal ion filtering may advantageously be achieved by both geometric collimation and electric collimation. While the geometric collimation is effective for both neutral and ions, the electrical collimation only effects metal ions (with help from DC bias and strong magnetic field arrangement). Higher metal ionization (due to less loss on the collimator) and/or narrow ion angular spread advantageously results in better deposition coverage. In some embodiments, the biased collimator can also be used to control the plasma potential.

Figure 1:
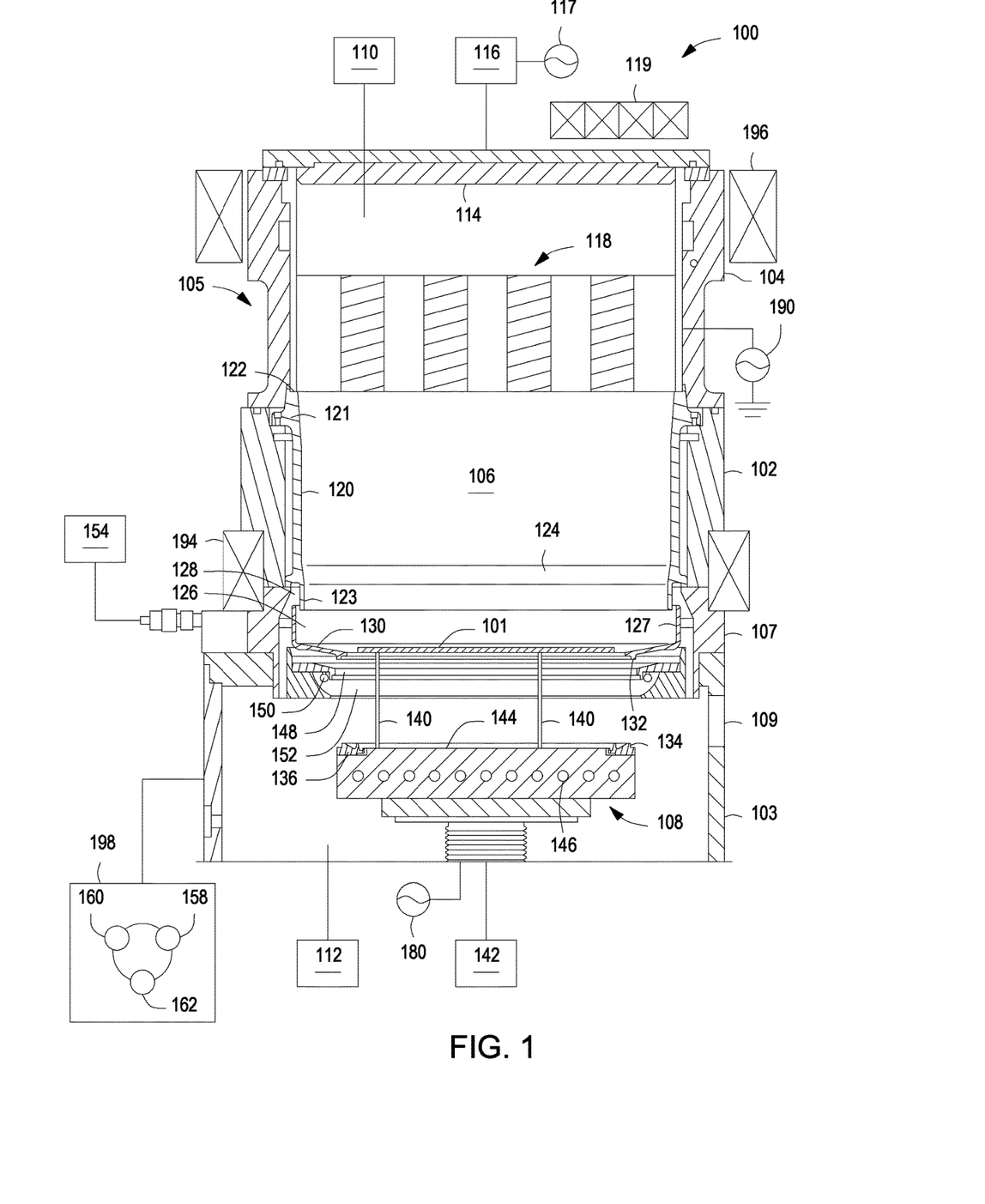
FIG. 1 depicts a schematic cross-sectional view of a process chamber in accordance with some embodiments of the present disclosure.

FIG. 1 illustrates a physical vapor deposition (PVD) chamber 100 (e.g., a sputter process chamber) having a bipolar collimator (collimator 118) suitable for sputter depositing materials according to some embodiments of the present disclosure. Examples of PVD chambers which may be adapted to benefit from the present disclosure include the ALPS® Plus and SIP ENCORE® PVD processing chambers, both commercially available from Applied Materials, Inc., Santa Clara, Calif. Processing chambers available from other manufacturers may also be adapted to perform the embodiments described herein.

The PVD chamber 100 has an upper sidewall 102, a lower sidewall 103, and a lid portion 104 defining a body 105 that encloses an interior volume 106 of the PVD chamber 100. An adapter plate 107 may be disposed between the upper sidewall 102 and the lower sidewall 103. A substrate support, such as a substrate support 108, is disposed in the interior volume 106 of the PVD chamber 100. A substrate transfer port 109 is formed in the lower sidewall 103 for transferring substrates into and out of the interior volume 106.

In some embodiments, the PVD chamber 100 comprises a sputtering chamber, also known as a physical vapor deposition (PVD) chamber, capable of depositing, for example, titanium, aluminum oxide, aluminum, aluminum oxynitride, copper, tantalum, tantalum nitride, tantalum oxynitride, titanium oxynitride, tungsten, or tungsten nitride on a substrate, such as the substrate 101.

A gas source 110 is coupled to the PVD chamber 100 to supply process gases into the interior volume 106. In some embodiments, process gases may include inert gases, non-reactive gases, and reactive gases (if desired). Examples of process gases that may be provided by the gas source 110 include, but not limited to, argon gas (Ar), helium (He), neon gas (Ne), nitrogen gas ($N_2$), oxygen gas ($O_2$), and water vapor $H_2O$ among others.

A pumping device 112 is coupled to the PVD chamber 100 in communication with the interior volume 106 to control the pressure of the interior volume 106. In some embodiments, the pressure level of the PVD chamber 100 may be maintained at about 1 Torr or less. In another embodiment, the pressure level of the PVD chamber 100 may be maintained at about 500 mTorr or less. In yet another embodiment, the pressure level of the PVD chamber 100 may be maintained at about 1 mTorr and about 300 mTorr.

The lid portion 104 may support a sputtering source 114, such as a target. In some embodiments, the sputtering source 114 may be fabricated from a material containing, or in some embodiments consisting essentially of, titanium (Ti), tantalum (Ta), tungsten (W), cobalt (Co), nickel (Ni), copper (Cu), aluminum (Al), alloys thereof, combinations thereof, or the like. For example, in some embodiments the sputtering source 114 may be fabricated from one or more materials selected from a group consisting of aluminum (Al), cobalt (Co), chromium (Cr), nickel (Ni), tantalum (Ta), titanium (Ti), tungsten (W), alloys thereof, combinations thereof and the like. In some embodiments, the sputtering source 114 may be fabricated from titanium (Ti), tantalum (Ta) or aluminum (Al).

The sputtering source 114 may be coupled to a source assembly 116 comprising a power supply 117 (e.g., a source power) for the sputtering source 114. The power supply 117 may provide RF source power or DC source power. In some embodiments, both RF and DC source power are provided. A magnetron assembly 119 which includes set of magnets may be coupled adjacent to the sputtering source 114 which enhances efficient sputtering materials from the sputtering source 114 during processing. Examples of the magnetron assembly include an electromagnetic linear magnetron, a serpentine magnetron, a spiral magnetron, a double-digitated magnetron, a rectangularized spiral magnetron, among others.

In some embodiments, a first set of magnets 194 may be disposed around the chamber body above the collimator, for example, between the adapter plate 107 and the upper sidewall 102 to assist generating electronic field to the metallic ions dislodged from the sputtering source 114. Furthermore, a second set of magnets 196 may be disposed around the chamber body below the collimator, for example, adjacent to the lid portion 104 to assist generating an electric field to dislodge materials from the sputtering source 114. The numbers, size, and strength of the magnets disposed around the PVD chamber 100 may be selected to improve plasma dissociation and sputtering efficiency. For example, in some embodiments, the first set of magnets 194 may have a total strength of about 500 to about 3000 gauss at the target surface. In some embodiments, the second set of magnets 196 may have a total strength of about 0 to about 300 gauss measured at about 7 inches away from (e.g., below) the target surface. In some embodiments, the guidance magnetic field created by the first set of magnets 194 and the second set of magnets 196 may have a total strength of about 10 to about 300 gauss measured at about 7 inches away from (e.g., below) the target surface. Individual magnets of the first set of magnets 194 can be permanent magnets, electromagnets (e.g., electromagnetic coils), or combinations thereof. Individual magnets of the second set of magnets 196 can be permanent magnets, electromagnets (e.g., electromagnetic coils), or combinations thereof. The overall magnetic field strength of the guidance magnetic field and the unbalance ratio of the magnetron assembly (e.g., the total surface area of the outer poles/total surface area of inner poles) can be optimized to generate a desired plasma density and to enhance the plasma diffusion. For example, typically, increasing the unbalance ratio (e.g., to about 2-5 or more), increases the plasma power density, leading to increased generation of metal ion flux.

In some embodiments, an additional RF power source 180 may also be coupled to the PVD chamber 100 through the substrate support 108 to provide a bias power between the sputtering source 114 and the substrate support 108. In some embodiments, the RF power source 180 may have a frequency between about 400 Hz and about 60 MHz, such as about 13.56 MHz.

A collimator 118 may be positioned in the interior volume 106 between the sputtering source 114 and the substrate support 108. The collimator 118 may be in bipolar mode so as to control a direction of the ions passing through the collimator 118. A controllable direct current (DC) or AC collimator power source 190 may be coupled to the collimator 118 to provide an alternating pulsed positive or negative voltage to the collimator 118 so as to control the collimator 118 in a bipolar mode (e.g., a bipolar power supply). Details regarding the bipolar collimator 118 will be further discussed below with reference to FIGS. 2-3. In some embodiments, the collimator power source 190 is a DC power source. In some embodiments, the collimator power source 190 is a bipolar pulsed DC power source.

A shield tube 120 may be in proximity to the collimator 118 and interior of the lid portion 104. The collimator 118 includes a plurality of apertures to direct gas and/or material flux within the interior volume 106. The collimator 118 may be mechanically and electrically coupled to the shield tube 120. In some embodiments, the collimator 118 is mechanically coupled to the shield tube 120, such as by a welding process, making the collimator 118 integral to the shield tube 120. In another embodiment, the collimator 118 may be electrically floating within the PVD chamber 100. In another embodiment, the collimator 118 may be coupled to an electrical power source and/or electrically coupled to the lid portion 104 of the body 105 of the PVD chamber 100.

The shield tube 120 may include a tubular body 121 having a recess 122 formed in an upper surface of the tubular body 121. The recess 122 provides a mating interface with a lower surface of the collimator 118. The tubular body 121 of the shield tube 120 may include a shoulder region 123 having an inner diameter that is less than the inner diameter of the remainder of the tubular body 121. In some embodiments, the inner surface of the tubular body 121 transitions radially inward along a tapered surface 124 to an inner surface of the shoulder region 123. A shield ring 126 may be disposed in the PVD chamber 100 adjacent to the shield tube 120 and intermediate of the shield tube 120 and the adapter plate 107. The shield ring 126 may be at least partially disposed in a recess 128 formed by an opposing side of the shoulder region 123 of the shield tube 120 and an interior sidewall of the adapter plate 107.

In one aspect, the shield ring 126 includes an axially projecting annular sidewall 127 that includes an inner diameter that is greater than an outer diameter of the shoulder region 123 of the shield tube 120. A radial flange 130 extends from the annular sidewall 127. The radial flange 130 may be formed at an angle greater than about ninety degrees (90°) relative to the inside diameter surface of the annular sidewall 127 of the shield ring 126. The radial flange 130 includes a protrusion 132 formed on a lower surface of the radial flange 130. The protrusion 132 may be a circular ridge extending from the surface of the radial flange 130 in an orientation that is substantially parallel to the inside diameter surface of the annular sidewall 127 of the shield ring 126. The protrusion 132 is generally adapted to mate with a recessed flange 134 formed in an edge ring 136 disposed on the substrate support 108. The recessed flange 134 may be a circular groove formed in the edge ring 136. The engagement of the protrusion 132 and the recessed flange 134 centers the shield ring 126 with respect to the longitudinal axis of the substrate support 108. The substrate 101 (shown supported on lift pins 140) is centered relative to the longitudinal axis of the substrate support 108 by coordinated positioning calibration between the substrate support 108 and a robot blade (not shown). Thus, the substrate 101 may be centered within the PVD chamber 100 and the shield ring 126 may be centered radially about the substrate 101 during processing.

In operation, a robot blade (not shown) carrying the substrate 101 is extended through the substrate transfer port 109. The substrate support 108 may be lowered to allow the substrate 101 to be transferred to the lift pins 140 extending from the substrate support 108. Lifting and lowering of the substrate support 108 and/or the lift pins 140 may be controlled by a drive 142 coupled to the substrate support 108. The substrate 101 may be lowered onto a substrate receiving surface 144 of the substrate support 108. With the substrate 101 positioned on the substrate receiving surface 144 of the substrate support 108, sputter deposition may be performed on the substrate 101. The edge ring 136 may be electrically insulated from the substrate 101 during processing. Therefore, the substrate receiving surface 144 may include a height that is greater than a height of portions of the edge ring 136 adjacent the substrate 101 such that the substrate 101 is prevented from contacting the edge ring 136. During sputter deposition, the temperature of the substrate 101 may be controlled by utilizing thermal control channels 146 disposed in the substrate support 108.

After sputter deposition, the substrate 101 may be elevated utilizing the lift pins 140 to a position that is spaced away from the substrate support 108. The elevated location may be proximate one or both of the shield ring 126 and a reflector ring 148 adjacent to the adapter plate 107. The adapter plate 107 includes one or more lamps 150 coupled to the adapter plate 107 in a position intermediate of a lower surface of the reflector ring 148 and a concave surface 152 of the adapter plate 107. The lamps 150 provide optical and/or radiant energy in the visible or near visible wavelengths, such as in the infra-red (IR) and/or ultraviolet (UV) spectrum. The energy from the lamps 150 is focused radially inward toward the backside (i.e., lower surface) of the substrate 101 to heat the substrate 101 and the material deposited on the substrate 101. Reflective surfaces on the chamber components surrounding the substrate 101 serve to focus the energy toward the backside of the substrate 101 and away from other chamber components where the energy would be lost and/or not utilized. The adapter plate 107 may be coupled to a coolant source 154 to control the temperature of the adapter plate 207 during heating.

After controlling the substrate 101 to a predetermined temperature, the substrate 101 is lowered to a position on the substrate receiving surface 144 of the substrate support 108. The substrate 101 may be rapidly cooled utilizing the thermal control channels 146 in the substrate support 108 via conduction. The temperature of the substrate 101 may be ramped down from the first temperature to a second temperature in a matter of seconds to about a minute. The substrate 101 may be removed from the PVD chamber 100 through the substrate transfer port 109 for further processing. The substrate 101 may be maintained at a predetermined temperature range, such as less than about 250 degrees Celsius.

A controller 198 is coupled to the PVD chamber 100. The controller 198 includes a central processing unit (CPU) 160, a memory 158, and support circuits 162. The controller 198 is utilized to control the process sequence, regulating the gas flows from the gas source 110 into the PVD chamber 100 and controlling ion bombardment of the sputtering source 114. The CPU 160 may be of any form of a general purpose computer processor that can be used in an industrial setting. The software routines can be stored in the memory 158, such as random access memory, read only memory, floppy or hard disk drive, or other form of digital storage. The support circuits 162 are conventionally coupled to the CPU 160 and may comprise cache, clock circuits, input/output subsystems, power supplies, and the like. The software routines, when executed by the CPU 160, transform the CPU into a specific purpose computer (controller) 198 that controls the PVD chamber 100 such that the processes are performed in accordance with the present disclosure. The software routines may also be stored and/or executed by a second controller (not shown) that is located remotely from the PVD chamber 100.

During processing, material is sputtered from the sputtering source 114 and deposited on the surface of the substrate 101. The sputtering source 114 and the substrate support 108 are biased relative to each other by the power supply 117 or RF power source 180 to maintain a plasma formed from the process gases supplied by the gas source 110. The DC pulsed bias power applied to the collimator 118 also assist controlling ratio of the ions and neutrals passing through the collimator 118, thus enhancing the trench sidewall and bottom fill-up capability. The ions from the plasma are accelerated toward and strike the sputtering source 114, causing target material to be dislodged from the sputtering source 114. The dislodged target material and process gases form a layer on the substrate 101 with predetermined compositions.

Figure 2:
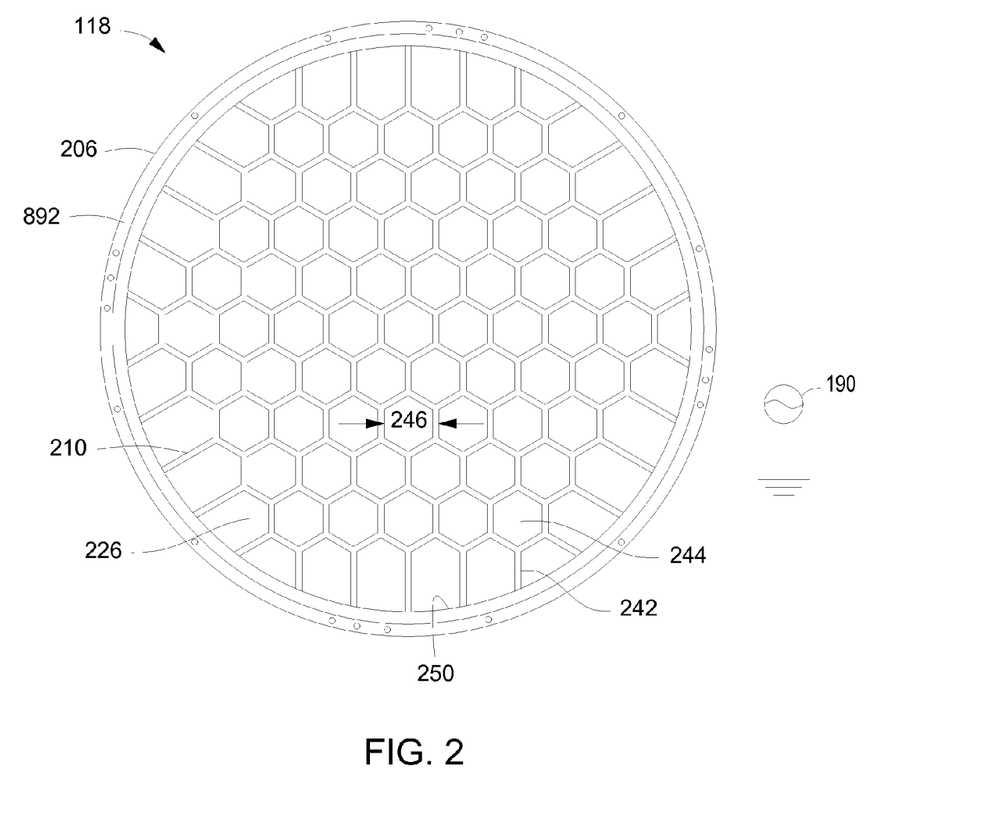
FIG. 2 depicts a top view of a collimator in accordance with some embodiments of the present disclosure.

FIG. 2 depicts a top view of the collimator 118 coupled to the collimator power source 190 that may be disposed in the PVD chamber 100 of FIG. 1. The collimator 118 is generally a honeycomb structure having hexagonal walls 226 separating hexagonal apertures 244 in a close-packed arrangement. An aspect ratio of the hexagonal apertures 244 may be defined as the depth of the aperture 244 (equal to the length of the collimator) divided by the width 246 of the aperture 244. In some embodiments, the thickness of the walls 226 is between about 0.06 inches and about 0.18 inches. In some embodiments, the thickness of the walls 226 is between about 0.12 inches and about 0.15 inches. In some embodiments, the collimator 118 is comprised of a material selected from aluminum, copper, and stainless steel.

The honeycomb structure of the collimator 118 may serve as an integrated flux optimizer 210 to optimize the flow path, ion fraction and ion trajectory behavior of ions passing through the collimator 118. In some embodiments, the hexagonal walls 226 adjacent to a shield portion 892 have a chamfer 250 and a radius. The shield portion 892 of the collimator 118 may assist installing the collimator 118 into the PVD chamber 100.

In some embodiments, the collimator 118 may be machined from a single mass of aluminum. The collimator 118 may optionally be coated or anodized. Alternatively, the collimator 118 may be made from other materials compatible with the processing environment, and may also be comprised of one or more sections. Alternatively, the shield portion 892 and the integrated flux optimizer 210 are formed as separate pieces and coupled together using suitable attachment means, such as welding.

The collimator 118 functions as a filter to trap ions and neutrals that are emitted from the material from the sputtering source 114 at angles exceeding a selected angle, near normal relative to the substrate 101. The collimator 118 may have an aspect ratio change across the width of the collimator 118 to allow different percentages of ions emitted, for example, a center or a peripheral region of the material from the sputtering source 114 to pass through the collimator 118. As a result, both the number of ions and the angle of arrival of ions deposited onto peripheral regions and center regions of the substrate 101 are adjusted and controlled. Therefore, material may be more uniformly sputter deposited across the surface of the substrate 101. Additionally, material may be more uniformly deposited on the bottom and sidewalls of high aspect ratio features, particularly high aspect ratio vias and trenches located near the periphery of the substrate 101.

In some embodiments, the collimator power source 190 coupled to the collimator 118 may supply a voltage power to the collimator 118 in a pulsing, or alternating fashion to assist local deposit onto the substrate 101. The collimator power source 190 is configured to provide negative and/or positive voltage pulses to the collimator 118 so as to control the collimator 118 in unipolar or bipolar mode. In some embodiments, the collimator 118 controlled in bipolar mode may control and trap ions, so as to create different ratio of ions and neutrals passing through the collimator 118. Not wishing to be bound by theory, for cases without the strong guidance magnetic field, the inventors believe that positive voltage pulses applied to the collimator 118 may draw electrons in the plasma toward the substrate surface while the negative voltage pulses applied to the collimator 118 may repel electrons in the plasma toward the target. Therefore, by pulsing alternating positive and negative voltage to the collimator 118, directionality of the ions and neutrals passing through the collimator 118 may be more efficiently controlled.

Figure 3:
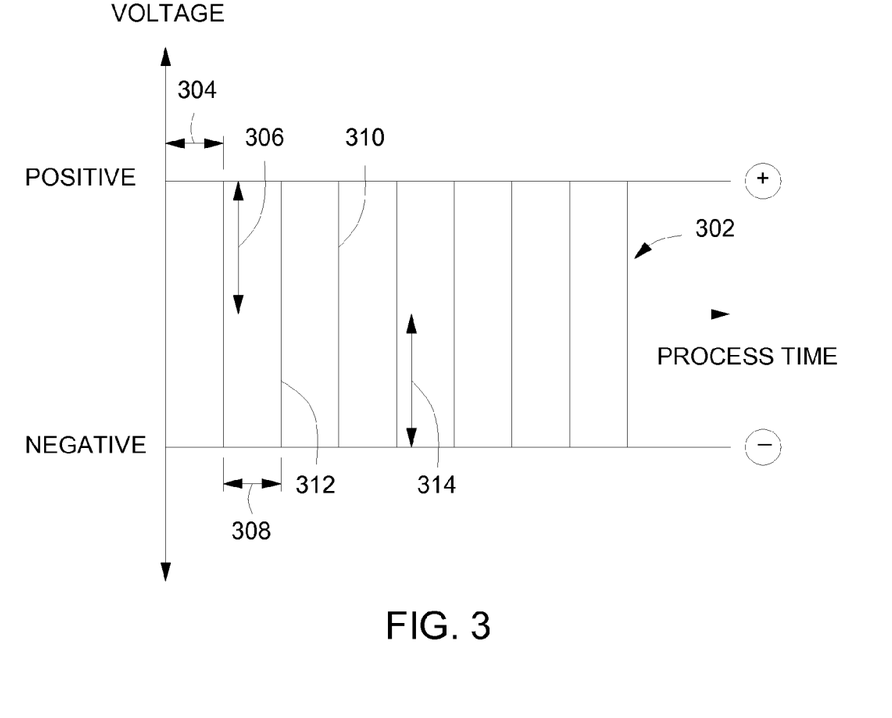
FIG. 3 depicts a voltage applied to the collimator of FIG. 2 plotted as a function of time in accordance with some embodiments of the present disclosure.

FIG. 3 depicts a voltage signal 302 detected from the collimator 118 when applying a DC power to the collimator 118. The voltage as supplied from the collimator power source 190 to the collimator 118 may be controlled in a pulsed mode, as depicted in FIG. 3, to pulse alternating positive voltage 310 and negative voltage 312 to the collimator 118. The positive and negative voltage pulses 310, 312 may have a predetermined pulse width 304, 308 (e.g., pulse time) and pulse magnitude 306, 314 (e.g., pulse voltage value) respectively. The pulse modulation (e.g., pulse width and pulse magnitude) is controlled to effectuate a predetermined deposition profile. For example, in embodiments in which more directional ions are accelerated toward the substrate surface to enhance bottom-up filling capability, a positive voltage may be supplied with a longer pulse width (e.g., longer pulse time) to assist deposition on the bottom of the trench. In contrast, in embodiments in which non-directional ions are deposited on sidewalls of the trench, or used to sputter-etch the deposit at the corner of the trench, a negative voltage may be supplied with a longer pulse width (e.g., longer pulse time) to enhance sidewall deposition management. The voltage supplied to the collimator 118 may also be in continuous mode.

In some embodiments, the DC bias power pulse from the collimator power source 190 may have a duty cycle between about 5 percent (e.g., 5 percent on and 95 percent off) to about 70 percent (e.g., 70 percent on and 30 percent off), such as between about 5 percent and about 50 percent, such as between about 15 percent and 45 percent, at a bias frequency between about 400 Hz and about 60 MHz. Alternatively, the cycle of the DC bias power pulsed to the collimator 118 may be controlled by a predetermined number of time periods performed. For example, the DC bias power may be pulsed from about every 1 millisecond to about every 100 milliseconds. In some embodiments, the DC bias power may be controlled at between about 1 kW and about 10 kW.

Figure 4:
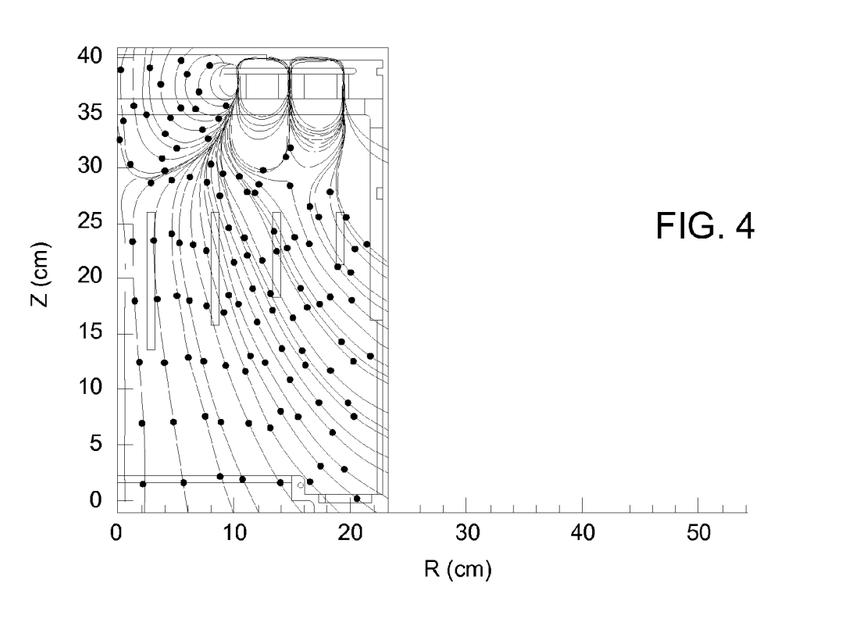
FIG. 4 depicts a magnetic field generated in a process chamber in accordance with some embodiments of the present disclosure.
Figure 5:
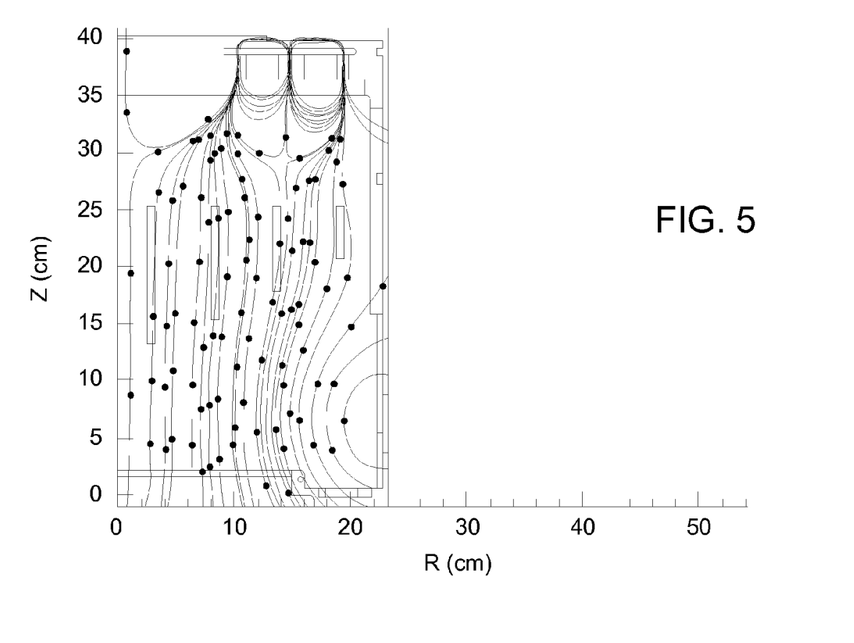
FIG. 5 depicts a magnetic field generated in a process chamber in accordance with some embodiments of the present disclosure.

FIG. 4 depicts the resulting direction of travel of ions passing through the collimator 118. As seen in FIG. 4, the direction of travel of the ions is not fully orthogonal to the substrate 101. To further correct the direction of travel and thereby improve deposition on the bottom of the trench, the second set of magnets 196 generate a guidance magnetic field that is substantially orthogonal to the collimator 118. The strong guidance field provides confinement of electrons and as a result, the direction of travel of the ions through the collimator 118 becomes more orthogonal to the substrate 101, as seen in FIG. 5, which advantageously reduces metal ion losses to walls of the collimator 118.

Figure 6A:
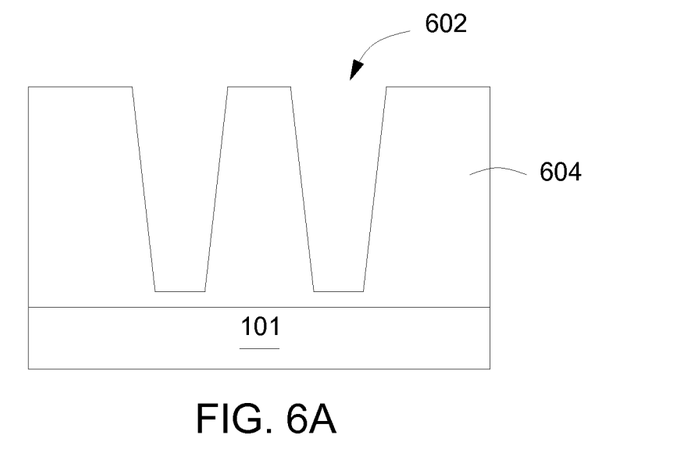
FIG. 6A-6B depicts cross sectional view of a substrate during manufacture of a metal layer deposition process in accordance with some embodiments of the present disclosure.

In some embodiments, the material from the sputtering source 114 utilized in the PVD chamber 100 depicted herein is a metal (such as a copper alloy) configured to deposit a metal layer (such as a copper layer) into openings 602 formed in an insulating material 604 disposed on the substrate 101, as shown in FIG. 6A. During deposition, a gas mixture is supplied to the PVD chamber 100 to form a metal layer 606 (such as a copper layer) from the sputtered material with high bottom-up filling capability into the openings 602 formed on the substrate 101. In some embodiments, the gas mixture may include reactive gas, non-reactive gas, inert gas, and the like. Examples of reactive and non-reactive gas include, but not limited to, $O_2$, $N_2$, $N_2O$, $NO_2$, $NH_3$, and $H_2O$, among others. Examples of inert gas include, but not limited to, argon (Ar), neon (Ne), helium (He), xenon (Xe), and krypton (Kr), among others. In one particular embodiment depicted herein, the gas mixture supplied to the process chamber includes at least one nitrogen containing gas and/or an inert gas. The metal alloy target made from a copper containing alloy may be utilized as a source material for the sputtering source 114 for sputter process. The copper (Cu) containing target as described here is only for illustration purposes and should not be construed as limiting the scope of the present disclosure. Furthermore, the metal or metal alloy target that may be utilized as the sputtering source 114 may be made by a material from a group consisting of aluminum (Al), cobalt (Co), chromium (Cr), nickel (Ni), tantalum (Ta), titanium (Ti), tungsten (W), alloys thereof, combinations thereof and the like.

After the gas mixture is supplied into the PVD chamber 100 for processing, a high voltage power is supplied to the sputtering source 114, for example the Cu target, to sputter the metal Cu source material from the sputtering source 114 in form of copper ions, such as $Cu^{2+}$. The bias power applied between the sputtering source 114 and the substrate support 108 maintains a plasma formed from the gas mixture in the PVD chamber 100. The DC bias pulse power supplied to the collimator 118 may assist controlling ion fraction, ratios, and ion trajectory path reaching toward the substrate surface. The ions mainly from the gas mixture in the plasma bombard and sputter off material from the sputtering source 114. The gas mixture and/or other process parameters may be varied during the sputtering deposition process, thereby creating a gradient in the deposited metal layer 606 with film properties controlled for different film quality requirements.

In some embodiments, the RF source power may be supplied between about 500 watts and about 25 kW at a frequency between about 400 kHz and about 60 MHz. A RF bias power may be applied to the substrate support at up to about 3000 watts at a frequency at 13.56 MHz or 2 MHz. In some embodiments, the RF source power may be supplied at the gas mixture between about 100 watts and about 3000 watts and at a frequency between about 400 kHz and about 60 MHz. Dual frequency or triple frequency might be used to modulate ion energy in certain cases. The DC bias power may be applied to the collimator between about 1 kW and about 10 kW in a pulsed mode. Alternatively, the DC bias power may be applied to the collimator in a continuous mode.

Several process parameters may also be controlled while supplying the gas mixture and the pulsed RF bias power mode to perform the deposition process. The pressure of the processing chamber may be controlled at between about 0.5 mTorr and about 500 mTorr, such as between about 1 mTorr and about 100 mTorr, for example about 20 mTorr. A substrate temperature may be controlled at between about −40 degrees Celsius and about 450 degrees Celsius.

Figure 6B:
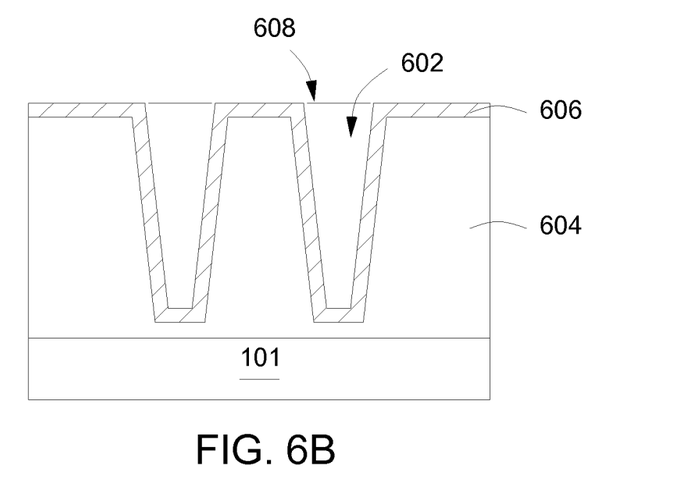

After the deposition process, a metal layer 606, such as a copper layer, may be conformally deposited in the opening 602 with good sidewall and bottom deposition management, as shown in FIG. 6B. The deposition process may be performed until the opening 602 defined in the layer of insulating material 604 has been entirely filled with the metal layer 606 showing by the phantom line 608.

Figure 7:
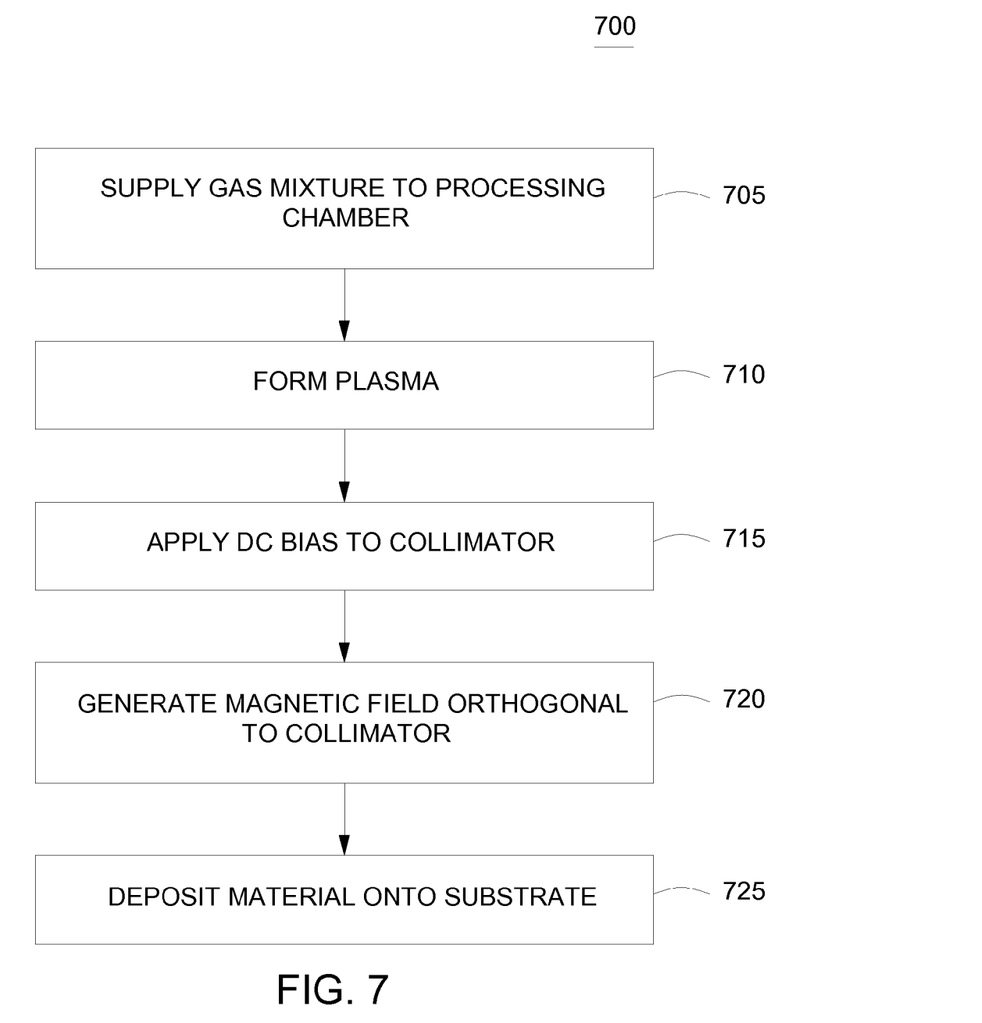
FIG. 7 depicts a flowchart of a method of depositing a metal layer on a substrate in accordance with some embodiments of the present disclosure.

FIG. 7 depicts a flowchart of a method of depositing material on a substrate in accordance with some embodiments of the present disclosure. At 705, a gas mixture is supplied to the processing chamber. At 710, an RF source power is applied to the gas mixture to form a plasma to sputter source material from a target disposed in the processing chamber. To control the direction of travel of the metal ions emitted from the source, a DC bias power is applied to a collimator disposed in the processing chamber at 715. At 720, a guidance magnetic field that is substantially orthogonal to the collimator is generated to further control the direction of travel of the metal ions. At 725, the sputtered source material is deposited onto the substrate.

Thus, apparatus having a bipolar collimator disposed in a physical vapor deposition chamber and methods of using the same have provided herein. By utilizing a bipolar collimator in a physical vapor deposition chamber a guidance magnetic field, an efficient control of the ion/neutral filtering effect may be obtained so as to efficiently control ion trajectory behavior and assist the bottom-up filling capability during the physical vapor deposition process.

While the foregoing is directed to embodiments of the present disclosure, other and further embodiments of the present disclosure may be devised without departing from the basic scope thereof.

The invention claimed is:

1. A substrate processing chamber, comprising:
a chamber body and a chamber lid disposed on the chamber body defining a processing region within the chamber body beneath the lid;
a target disposed under the chamber lid;
a collimator disposed in the processing region;
a power source coupled to the collimator; and
a first set of magnets disposed around the chamber body above the collimator, wherein the first set of magnets have a total strength of about 500 to about 3000 gauss at the target surface and a second set of magnets disposed around the chamber body and below the collimator that together create a guidance magnetic field that is substantially orthogonal to the collimator.

2. The substrate processing chamber of claim 1, wherein the power source is one or more of a DC power source or an RF power source.

3. The substrate processing chamber of claim 1, wherein the power source is a bipolar power supply.

4. The substrate processing chamber of claim 1, wherein the power source is a bipolar pulsed DC power source.

5. The substrate processing chamber of claim 1, wherein the collimator is configured in bipolar mode.

6. The substrate processing chamber of claim 1, wherein the target is fabricated from aluminum, titanium, tantalum, tungsten, chromium, nickel, copper, cobalt, alloys thereof, or combinations thereof.

7. The substrate processing chamber of claim 1, further comprising:
an RF bias power coupled to a substrate support disposed in the processing chamber.

8. The substrate processing chamber of claim 7, wherein the guidance magnetic field is substantially orthogonal to the substrate support.

9. The substrate processing chamber of claim 1, wherein the second set of magnets comprise a plurality of electromagnetic coils.

10. The substrate processing chamber of claim 1, further comprising:
a magnetron assembly disposed above the chamber lid.

11. A substrate processing chamber, comprising:
a chamber body and a chamber lid disposed on the chamber body defining a processing region within the chamber body beneath the lid;
a target disposed under the chamber lid;
a collimator disposed in the processing region under the lid;
a DC power source coupled to the collimator; and
a first set of magnets disposed around the chamber body above the collimator and a second set of magnets disposed around the chamber body and below the collimator, wherein the first set of magnets have a total strength of about 500 to about 3000 gauss at the target surface, wherein the second set of magnets have a total strength of about 0 to about 300 gauss measured about 7 inches away from the target, and wherein the first and second sets of magnets together create a guidance magnetic field that is substantially orthogonal to the collimator.

12. The substrate processing chamber of claim 11, wherein the DC power source is a bipolar pulsed DC power source.

13. The substrate processing chamber of claim 11, wherein the target is fabricated from aluminum, titanium, tantalum, tungsten, chromium, nickel, copper, cobalt, alloys thereof, or combinations thereof.

14. The substrate processing chamber of claim 11, further comprising:
a RF bias power coupled to a substrate support disposed in the processing chamber.

15. The substrate processing chamber of claim 14, wherein the guidance magnetic field is substantially orthogonal to the substrate support.

16. The substrate processing chamber of claim 11, wherein the second set of magnets comprise a plurality of electromagnetic coils.

17. A method of depositing material on a substrate, comprising:
supplying a gas mixture into a processing chamber;
applying a RF or DC source power to form a plasma from the gas mixture to sputter source material from a target disposed in the processing chamber;
applying a DC bias power to a collimator disposed in the processing chamber;
generating a guidance magnetic field substantially orthogonal to the collimator and having a total strength of about 500 to about 3000 gauss at the target surface using a first set of magnets disposed around the process chamber above the collimator and a second set of magnets disposed around the chamber body and below the collimator; and
depositing the source material onto the substrate.

18. The method of claim 17, wherein applying the DC bias power to the collimator further comprises:
alternatively pulsing a positive voltage and a negative voltage to the collimator.

19. The method of claim 17, wherein generating the guidance magnetic field comprises:
providing a first set of magnets disposed around the processing chamber above the collimator and a second set of magnets disposed around the processing chamber and below the collimator that together create the guidance magnetic field.

20. The substrate processing chamber of claim 1, wherein the second set of magnets have a total strength of about 0 to about 300 gauss measured about 7 inches away from the target.

* * * * *